United States Patent
Hioki et al.

(10) Patent No.: US 7,763,957 B2
(45) Date of Patent: Jul. 27, 2010

(54) ACTIVE MATRIX TYPE DISPLAY DEVICE AND METHOD OF MANUFACTURING THE SAME

(75) Inventors: Tsuyoshi Hioki, Kanagawa-Ken (JP); Masahiko Akiyama, Tokyo (JP); Mitsuo Nakajima, Kanagawa-Ken (JP); Yujiro Hara, Kanagawa-Ken (JP); Yutaka Onozuka, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 11/756,938

(22) Filed: Jun. 1, 2007

(65) Prior Publication Data
US 2007/0235736 A1 Oct. 11, 2007

Related U.S. Application Data

(62) Division of application No. 11/208,736, filed on Aug. 23, 2005, now Pat. No. 7,265,385, which is a division of application No. 10/438,940, filed on May 16, 2003, now Pat. No. 6,987,284.

(30) Foreign Application Priority Data
May 17, 2002 (JP) ............................... 2002-142373

(51) Int. Cl.
*H01L 23/58* (2006.01)
(52) U.S. Cl. ............................ 257/633; 257/59; 257/60; 349/122; 349/150
(58) Field of Classification Search .................. 257/59, 257/60, 64, 633–637; 349/122, 150
See application file for complete search history.

(56) References Cited

U.S. PATENT DOCUMENTS

| 3,666,948 A | | 5/1972 | Mechiowitz et al. |
| 5,721,601 A | * | 2/1998 | Yamaji et al. ............... 349/138 |
| 6,309,901 B1 | | 10/2001 | Tahon et al. |
| 6,445,438 B1 | | 9/2002 | Horie et al. |
| 6,946,361 B2 | * | 9/2005 | Takayama et al. ........... 438/455 |

FOREIGN PATENT DOCUMENTS

JP 2001-215481 8/2001

OTHER PUBLICATIONS

T. Hioki, et al., IDW '02 Proceedings, pp. 319-322 "A Flexible 8.4-In. Color Low Temperature Poly-Si TFT-LCD", Dec. 4, 2002.

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

A method of manufacturing an active matrix type display device, which is reliable and flexible, is provided. An active matrix type display device according to an aspect of the present invention includes: a first substrate, which is flexible; a thin glass layer provided on the first substrate via an adhesion layer, and having projections and depressions on a surface thereof opposing to the first substrate, the projections and depressions having rounded tips and bottoms; active elements provided on the thin glass layer, each active element corresponding to a pixel; a display provided above the thin glass layer, and driven by the active elements to display an image pixel by pixel; and a second substrate provided on the display, and having an opposing electrode formed thereon.

5 Claims, 14 Drawing Sheets

CHEMICAL FORMULA $$X-(CH_2)_n-Y$$

WHERE X IS ANY ONE OF $-OCH_3$, $-OC_2H_5$, AND $-OC_2H_4OCH_3$, AND Y IS ANY ONE OF $-Cl, -NH_2, -SH, -CH=CH_2$, $-OCOC(CH_3)=CH_2, -\underset{\underset{O}{\diagdown\diagup}}{CH}-CH_2$,

AND $-NHCONH_2$

FIG. 31

ACTIVE MATRIX TYPE DISPLAY DEVICE AND METHOD OF MANUFACTURING THE SAME

CROSS-REFERENCE TO RELATED APPLICATIONS

The present application is a Divisional of U.S. application Ser. No. 11/208,736, filed Aug. 23, 2005 now U.S. Pat. No. 7,265,385, which in turn is a Divisional of U.S. application Ser. No. 10/438,940, filed on May 16, 2003 now U.S. Pat. No. 6,987,284, and in turn claims priority to Japanese Patent Application No. 2002-142373, filed on May 17, 2002, the entire contents of each of which are incorporated herein by reference.

BACKGROUND OF THE INVENTION

1. Field of the Invention

The present invention relates to an active matrix type display device and a method of manufacturing the same.

2. Related Art

In an active matrix type display device, which is widely used at present, a highly heat-resistant substrate, e.g., a non-alkali glass substrate, is used as a substrate on which devices are formed during an active element forming process, and the highly heat-resistant substrate is continuously used as a supporting substrate of the display device.

When a thin film transistor is formed by using a polycrystalline silicon layer as a semiconductor layer in which a channel region is formed, the following procedure is employed, taking into consideration the processing temperature etc. at the time of forming each functional film.

First, a barrier layer is formed on a device forming substrate of non-alkali glass so that the minor constituent of the glass does not seep therefrom. Then, an amorphous silicon layer is formed thereon. Subsequently, a short-time local heat treatment using an excimer laser is performed on the workpiece so that the amorphous silicon layer becomes a polycrystalline silicon layer through the solid phase or liquid phase growth. Thereafter, the thus obtained polycrystalline silicon layer is shaped. Subsequently, a thin film to serve as a gate insulating film is deposited, and then a metal layer, on which a gate electrode and a gate wiring are formed, is formed and shaped. Furthermore, an ion implantation is performed using the gate electrode as a mask through the ion doping method in order to form a source and drain regions in the polycrystalline silicon layer. Then, a thermal processing is performed to activate ions. Accordingly, a channel region and a source and drain regions are formed in the polycrystalline silicon layer. Subsequently, an interlayer dielectric film is formed to isolate the signal lines etc. and the gate lines, and then contact holes to the source and drain regions are formed. Then, a metal layer is formed and shaped to make a source and drain electrodes, to form a thin film transistor and wirings. When an active matrix type liquid crystal display device is formed, the device forming substrate, on which the active elements are formed, is continuously used as a supporting substrate.

When a display device having a curved display surface should be manufactured, a light and flexible substrate, such as a plastic substrate, is used as a supporting substrate. Such a light and flexible substrate is preferable as a supporting substrate of a display device used in a mobile information terminal. However, since such a plastic substrate does not have a sufficient heat-resistance or a sufficient dimensional stability, it is not possible to use such a plastic substrate as a device forming substrate on which active elements of polycrystalline silicon, which are superior in switching properties, are formed, and to continuously use the plastic substrate as a supporting substrate. Accordingly, a method is employed, in which active elements are formed on a device forming substrate of glass, etc., which is highly resistant to a high temperature process, and then the active elements are transferred to a light and flexible supporting substrate formed of, e.g., a plastic. More specifically, active elements are formed on a device forming substrate of glass, the side on which the active elements are formed is bonded to a temporary substrate. Then, the device forming substrate is removed by the etching, etc., and the active elements are transferred to a final supporting substrate.

In the above-described method, however, the process of forming active elements and their wirings on a device forming substrate, which is superior in heat resistance, and then transferring them to, e.g., a plastic substrate, has a problem in the way of removing the device forming substrate used to form the active elements.

For example, in the case where the device forming substrate used to form the active elements should be completely removed, it is difficult to etch the device forming substrate without damaging the active elements on the device forming substrate.

With respect to the case where it is not necessary to completely remove the device forming substrate used to form the active elements, the present inventors have developed a display device in which the thickness of a supporting substrate of glass, on which active elements are formed, is reduced, and then the glass substrate is bonded to a flexible sheet via an adhesion layer (for example, see Japanese Patent Application No. 2002-84924). In this display device, if the flexible sheet is bent to form a curved display, it may be possible that the glass substrate breaks. Therefore, this display device is not reliable when used in a curved application.

As described above, it has been difficult to obtain a reliable and flexible display device without damaging the active matrix devices by first forming active matrix devices and their wirings on a highly heat-resistant device forming substrate, and then transferring them to a flexible plastic substrate.

SUMMARY OF THE INVENTION

An active matrix type display device according to a first aspect of the present invention includes: a first substrate, which is flexible; a thin glass layer provided on the first substrate via an adhesion layer, and having projections and depressions on a surface thereof opposing to the first substrate, the projections and depressions having rounded tips and bottoms; active elements provided on the thin glass layer, each active element corresponding to a pixel; a display provided above the thin glass layer, and driven by the active elements to display an image pixel by pixel; and a second substrate provided on the display, and having an opposing electrode formed thereon.

An active matrix type display device according to a second aspect of the present invention includes: a first substrate, which is flexible; a thin glass layer provided on the first substrate via an adhesion layer; active elements provided on the thin glass layer, each active element corresponding to a pixel; a display provided above the thin glass layer, and driven by the active elements to display an image pixel by pixel; and a second substrate provided on the display, and having an opposing electrode formed thereon, a thickness of the thin glass layer in regions corresponding to the active elements being thicker than a thickness of other regions.

An active matrix type display device according to a third aspect of the present invention includes: a first substrate, which is flexible; a thin glass layer provided on the first substrate via an adhesion layer; a compressive stress applying layer provided between the adhesion layer and the thin glass layer, the compressive stress applying layer applying a compressive stress to a surface of the thin glass layer at a side of the adhesion layer; active elements provided on the thin glass layer, each active element corresponding to a pixel; a display provided above the thin glass layer, and driven by the active elements to display an image pixel by pixel; and a second substrate provided on the display, and having an opposing electrode formed thereon.

An active matrix type display device according to a fourth aspect of the present invention includes: a first substrate, which is flexible; a thin glass layer provided on the first substrate via an adhesion layer; a hydroxyl group blocking layer provided between the adhesion layer and the thin glass layer, and blocking a soakage of a hydroxyl group; active elements provided on the thin glass layer, each active element corresponding to a pixel; a display provided above the thin glass layer, and driven by the active elements to display an image pixel by pixel; and a opposing substrate provided on the display.

An active matrix type display device according to a fifth aspect of the present invention includes: a first substrate, which is flexible; a thin glass layer provided on the first substrate via an adhesion layer; active elements provided on the thin glass layer, each active element corresponding to a pixel; a display provided above the thin glass layer, and driven by the active elements to display an image pixel by pixel; a second substrate provided on the display, and having an opposing electrode formed thereon; and a reinforcing member having a mesh structure, provided in the adhesion layer.

A method of manufacturing an active matrix type display device according to a sixth aspect of the present invention includes: forming active elements each corresponding to a pixel on a device forming substrate of glass; polishing the device forming substrate to make it thinner by first performing a mechanical polishing, and then performing a chemical polishing; bonding a surface of the device forming substrate, which has been polished, to a plastic substrate via an adhesion layer; and forming a display driven by the active elements to display an image pixel by pixel, by placing a counter substrate so as to oppose to the device forming substrate.

A method of manufacturing an active matrix type display device according to a seventh aspect of the present invention includes: forming active elements each corresponding to a pixel on a device forming substrate of glass; polishing the device forming substrate to make it thinner; forming a compressive stress applying layer on a polished surface of the device forming substrate, a coefficient of linear expansion of the compressive stress applying layer being larger than a coefficient of linear expansion of the device forming substrate, and then cooling the compressive stress applying layer; bonding a plastic substrate to a surface of the device forming layer, on which the compressive stress applying layer is formed; and forming a display driven by the active elements to display an image pixel by pixel, by placing a counter substrate so as to oppose to the device forming substrate.

BRIEF DESCRIPTION OF THE DRAWINGS

FIGS. 1A and 1B show an active matrix type display device according to the first embodiment of the present invention, of which FIG. 1A is a plan view and FIG. 1B is a sectional view taken on line A-A' of FIG. 1A.

FIG. 31 shows a chemical formula of a silane coupling agent.

DESCRIPTION OF THE EMBODIMENTS

Figure 1A:
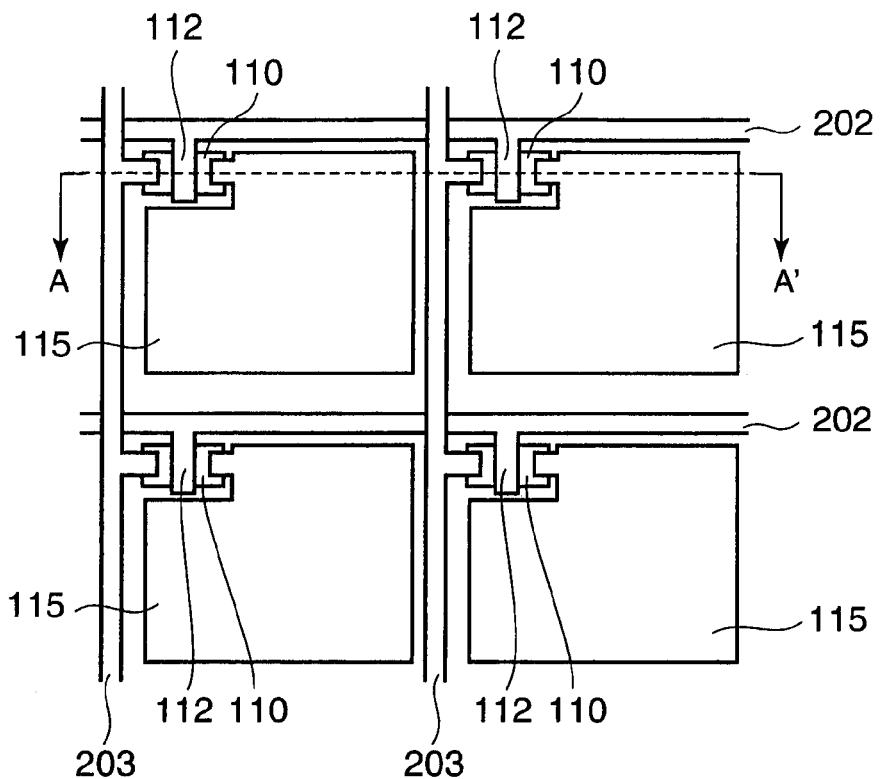

Embodiments of the present invention are intended to give a flexibility and a strength to an active matrix type display device obtained by first forming active elements on a glass substrate serving as a device forming substrate, then making the glass substrate thinner, and then bonding the glass substrate to a flexible supporting substrate, which can be bent, such as a plastic substrate, via an adhesion layer.

The mechanical properties of a glass substrate with a thickness of as thin as a few tens of □m (thin glass layer) are not away from the mechanical properties of glass. The softness and the flexural strength of the glass are dependent on the Griffith's crack theory relating to the brittle fractures caused by cracks existing in the surface area. If there are cracks, the physical property value of, e.g., the flexural strength of glass decreases to about ¹⁄₁₀ or less of that of an ideal glass surface that does not have any crack. Accordingly, it is possible to improve the flexibility and the reliability of an active matrix type display device by introducing a structure for preventing the development of cracks existing in the surface of a thin glass layer. In the present invention, the following means are employed to prevent the development of cracks existing in the surface of the thin glass layer contacting the adhesion layer.

First, the thickness of a surface of the thin glass layer, which is bonded to the plastic substrate, is shaped to have gentle projections and depressions having a height of a fiftieth or more and a half or less of the thickness of the thin glass layer. This can be achieved by first mechanically polishing the glass substrate, and then chemically polishing the surface of the glass substrate, so that the tips and bottoms of the projections and depressions are rounded. Further, due to the above-described chemical polishing, the angled portions at the tips of the cracks can be rounded. Subsequently, the surface of the thin glass layer to be bonded to the plastic substrate is shaped to have a waveform shape, thereby preventing the overconcentration of the tensile stress to the cracks.

Second, the thickness of the thin glass layer is adjusted so that the areas including the devices such as active elements and wirings constituting the active matrix become thicker, and the other areas become thinner. The reason for such adjustment is that the areas of the glass substrate, on which active elements constituting the active matrix are formed, receive a relatively large residual stress, resulting in that the strength of those areas decreases. In order to solve this problem, the thickness of the areas including the active elements is increased to improve the strength.

Third, a compressive stress is applied to a surface of the thin glass layer, which is bonded to the plastic substrate. Generally, a crack of glass develops when a tensile stress is applied to the tip thereof. Accordingly, a compressive stress is generally applied to the surface of a glass substrate so as to prevent the development of cracks. However, since a thin glass layer is formed by polishing a device forming substrate, the inside area of the glass, to which the tensile stress is applied, is exposed. Accordingly, cracks are easy to develop. Therefore, if a compressive stress is applied to the polished surface of the thin glass layer in the initial state, when the entire active matrix type display device is bent so as to apply a tensile stress to the polished surface of the thin glass layer, it is possible to prevent the development of cracks. The compressive stress is applied by forming a compressive stress applying layer on the polished surface of the thin glass layer by the use of a material having a higher coefficient of linear expansion than glass, and by cooling it so as to apply a compressive stress inside the surface of the thin glass layer.

Fourth, a hydroxyl group blocking layer for blocking molecules having hydroxyl groups, such as moisture, is formed on the surface of the thin glass layer, which is to be bonded to the plastic substrate. It is known that hydroxyl radicals advance the development of cracks in glass. Since the thin glass layer of the active matrix type display device according to the embodiments of the present invention is formed by polishing the device forming substrate, which eliminates the initially applied compressive stress, it is possible to prevent the development of cracks in the thin glass layer by providing a layer of preventing the development of cracks between the thin glass layer and the adhesion layer.

Fifth, a reinforcing member having a mesh structure is provided inside the adhesion layer. Preferably, this reinforcing member is provided inside the adhesion layer directly below the areas on which the active elements are formed. With the reinforcing member, it is possible to reinforce the thin glass layer at the portions on which the active elements are formed, and which have a relatively large residual stress leading to the decrease in strength. Accordingly, it is possible to considerably improve the strength of the glass layer.

Hereinafter, the embodiments of the present invention will be described with reference to the accompanying drawings. It should be noted that the present invention is not limited to the following embodiments.

First Embodiment

Figure 1B:
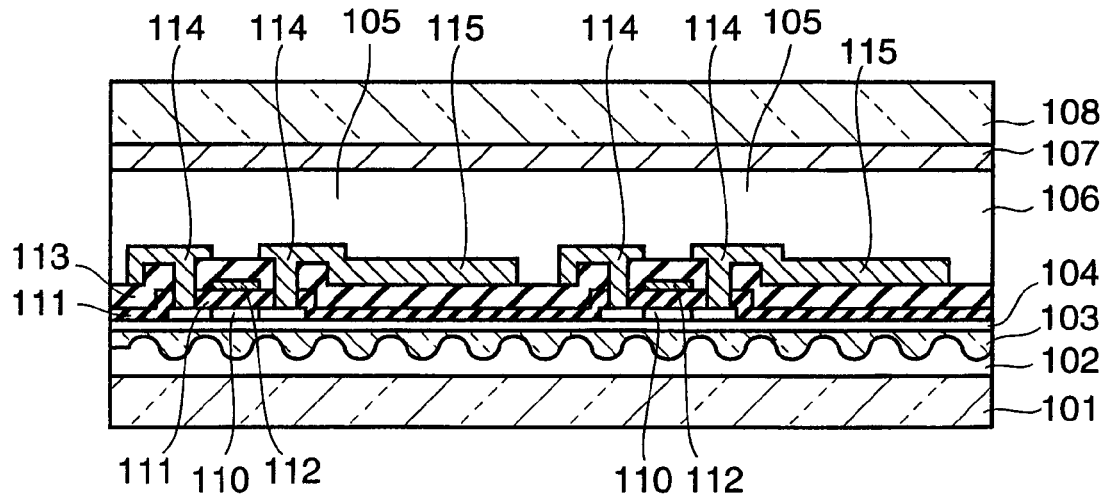

The first embodiment of the present invention will be described below. FIGS. 1A and 1B show an active matrix type display device in this embodiment. FIG. 1A is a plan view, and FIG. 1B is a sectional view taken on line A-A' of FIG. 1A. FIGS. 2 to 6 are sectional views showing the steps of forming an active element of the active matrix type display device of this embodiment. FIGS. 7 to 10 are sectional views showing the transfer process of the active matrix type display device of this embodiment. It should be noted that although 2×2 devices are shown in FIG. 1A, two devices are shown in FIGS. 1B and 7-10, and one device is shown in FIGS. 2-6, actually a great number of such devices are arranged in a two dimensional array.

In this embodiment, active elements are formed by using a glass substrate as a device forming substrate; the device forming substrate is first mechanically polished, and then chemically polished, thereby making a thin glass layer having projections and depressions with a height of a fiftieth or more and a half or less of the thickness of the thin glass layer; and the active matrix type display device is completed with thus obtained thin glass layer. In other words, the strength of the thin glass layer is improved by changing the shape of the polished surface of the thin glass layer after being subjected to the mechanical polishing from a sharp shape to a rounded shape by the chemical polishing. Here, the height of the projections and depressions means the maximum length from a tip of a projection to a bottom of a depression.

As shown in FIGS. 1A and 1B, the active matrix type display device of this embodiment includes a plastic substrate 101, a thin glass layer 103, which is located on the plastic substrate 101 via an adhesion layer 102, an undercoat layer 104 located on the thin glass layer 103, thin film transistors (active elements) 105, each corresponding to a pixel, and located on the undercoat layer 104, a liquid crystal layer (optical valve elements) 106 located above the thin glass layer 103, and driven by the thin film transistors 105 to display an image pixel by pixel, and an opposing substrate 108 having an opposing electrode 107 and located on the liquid crystal layer 106. The thin glass layer 103 has projections and depressions having a height of a fiftieth or more and a half or less of the thickness of the thin glass layer 103 on the surface opposing to the plastic substrate 101.

Each active element 105 includes an active layer 110, which is formed like an island, a gate insulating layer 111 formed all over the active layer 110, a gate electrode 112 formed on the gate insulating layer 111 in a region corresponding to the active layer 110, an interlayer dielectric film 113 formed all over the gate electrode 112, and a source and drain electrodes 114 each connected to the active layer 110 via a contact hole formed through the gate insulating layer 111 and the interlayer dielectric film 113. One of the source and drain electrodes 114 is connected to a pixel electrode 115.

Next, a method of manufacturing an active element of the active matrix type display device according to this embodiment will be described with reference to FIGS. 2 to 6.

Figure 2:
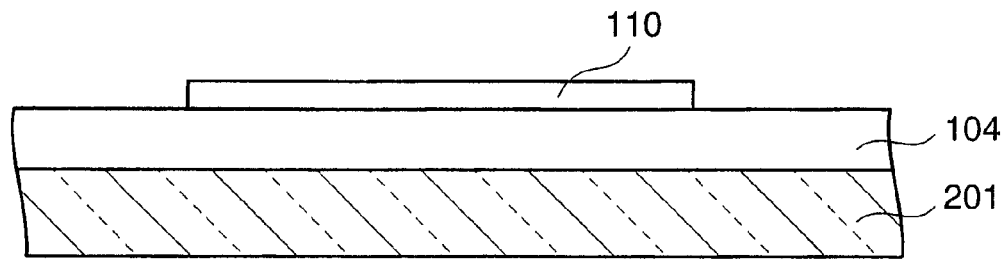
FIG. 2 is a sectional view showing a step of a method of forming an active element of the active matrix type display device according to the first embodiment of the present invention.

First, as shown in FIG. 2, the undercoat layer 104 of silicon oxide or silicon nitride is deposited on a non-alkali glass substrate (device forming substrate) 201, which has been sufficiently cleaned, through the plasma enhanced chemical vapor deposition (PECVD) method, etc., using a material such as silane. With the undercoat layer 104, it is possible to prevent the trace of alkali elements from seeping from the glass substrate 201.

Then, the active layer 110 is formed by first growing an amorphous-silicon layer through the PECVD method, etc., and then instantaneously melting it by irradiating it with an excimer laser using KrF, etc., to make a polycrystalline silicon layer. Then, the thus obtained polycrystalline silicon layer is isolated through the anistropic etching method using the reactive ion etching (RIE) method by the use of a fluorine gas.

Figure 3:
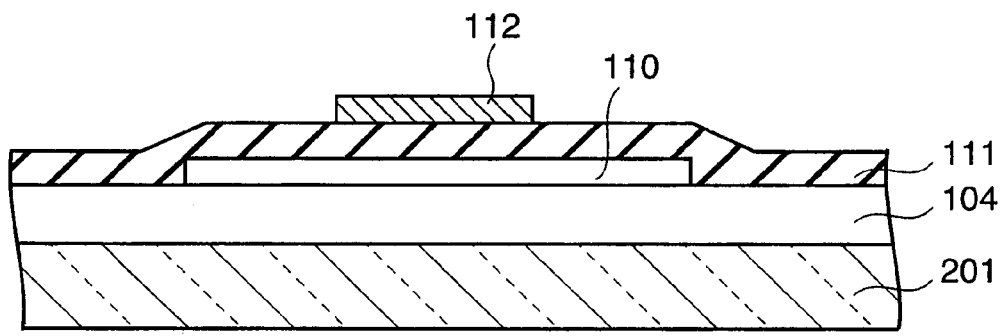
FIG. 3 is a sectional view showing a step of the method of forming an active element of the active matrix type display device according to the first embodiment of the present invention.

Subsequently, the gate insulating layer 111 of silicon oxide or silicon nitride is formed through the PECVD method so as to cover the active layer 110, as shown in FIG. 3.

Next, the gate electrode 112 is formed. First, a metal layer of Mo, W, Ta, or an alloy thereof, is deposited on the gate insulating layer 111 using the sputtering method, etc. A photoresist is applied to the metal layer. Then, a resist pattern is formed by using the photolithography method. Finally, the gate insulating layer 112, the shape of which corresponds to that of the active layer 110, and gate lines 202 having predetermined shapes are formed by selectively removing the metal layer in the areas that do not have resist patterns by soaking the workpiece in a solvent.

Figure 4:
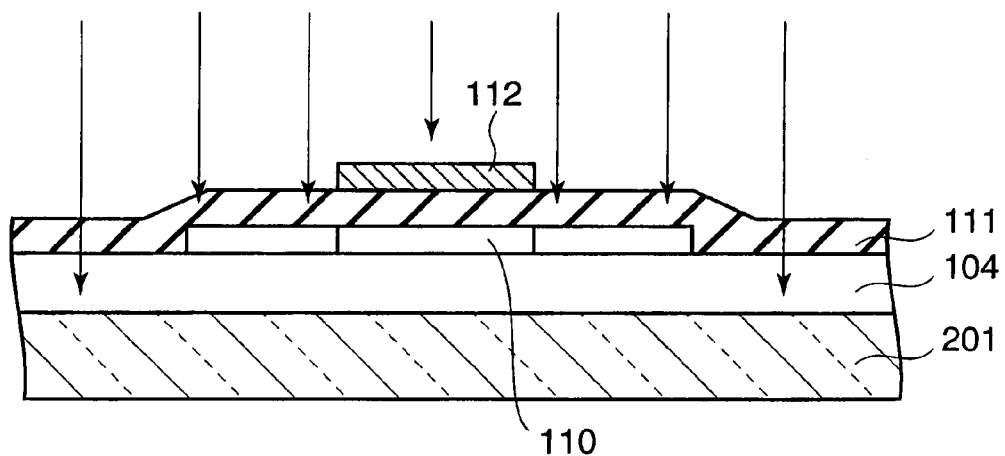
FIG. 4 is a sectional view showing a step of the method of forming an active element of the active matrix type display device according to the first embodiment of the present invention.

Then, as shown in FIG. 4, an impurity is implanted to the active layer 110 so as to form a contact surface in a region to contact to a source and drain electrodes, which will be described later. In this embodiment, phosphorous (P) is used as the impurity. As shown by arrows in FIG. 4, the impurity is implanted by using the gate electrode 112 as a mask through the ion doping method with the ion concentration of about $10^{22}$ cm$^{-3}$. Subsequently, a thermal treatment is performed to activate the implanted phosphorous.

Figure 5:
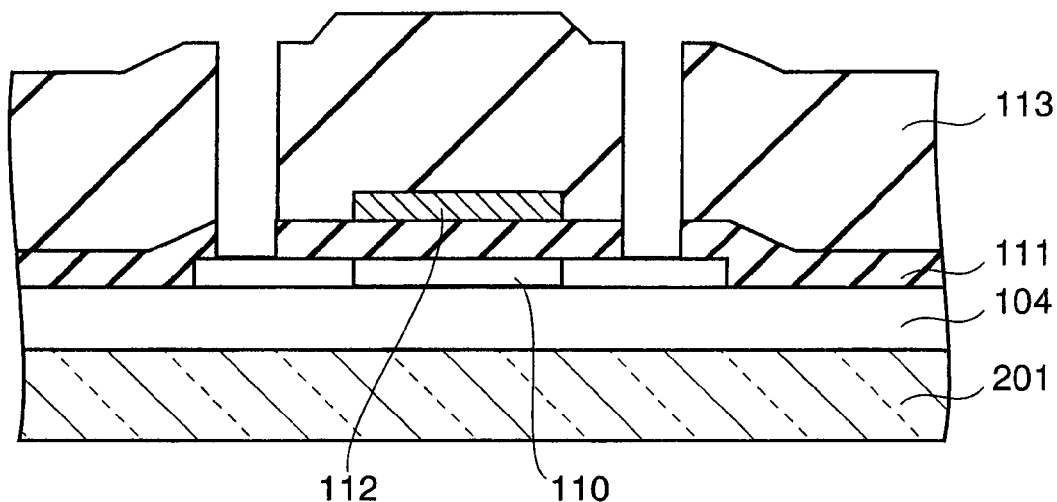
FIG. 5 is a sectional view showing a step of the method of forming an active element of the active matrix type display device according to the first embodiment of the present invention.

Next, as shown in FIG. 5, a silicon oxide layer or a silicon nitride layer to serve as an interlayer dielectric film 113 is grown to cover the gate electrode 112 and the gate lines 202 through the atmosphere pressure chemical vapor deposition (APCVD) method. Then, a through-hole for the source and drain electrodes to contact the active layer 110 is formed through the interlayer dielectric film 113 and the gate insulating layer 111 through the photo-etching process.

Figure 6:
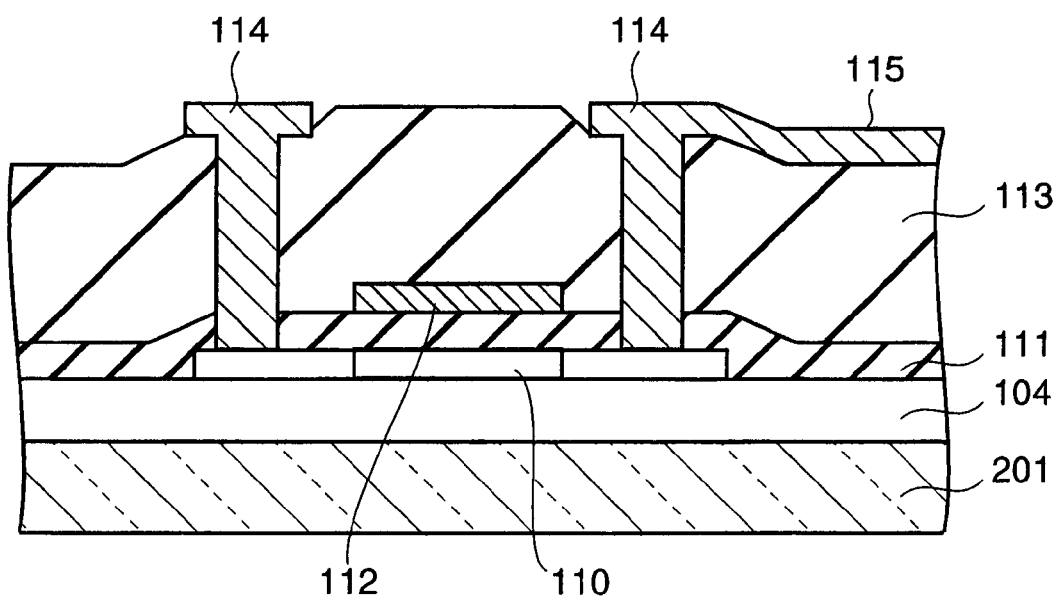
FIG. 6 is a sectional view showing a step of the method of forming an active element of the active matrix type display device according to the first embodiment of the present invention.

Subsequently, as shown in FIG. 6, a metal such as Mo, Ta, W, Al, Ni, etc., or an alloy thereof, or layers thereof, is (are) deposited on the interlayer dielectric film 113 so as to connect to the active layer 110 via the through-hole. Then, a source and drain electrodes 114 and signal lines 203 are formed through the same photo-etching process as that used to form the gate electrode. One of the source and drain electrodes 114 is connected to the pixel electrode 115.

In this thin film transistor and wiring forming process, a thermal treatment at a temperature of, e.g., 500° C. or more should be performed. Since the device forming substrate of this embodiment is a non-alkali glass substrate which is widely used to manufacture amorphous silicon thin film transistors and polycrystalline silicon thin film transistors, and the thickness thereof is the same level as that used to manufacture amorphous silicon thin film transistors and polycrystalline silicon thin film transistors, there is no problem in manufacturing thin film transistors and wirings of this embodiment at such a temperature. In addition, when polycrystalline silicon thin film transistors are manufactured, it is possible to employ the conventional fabricating method.

Next, a method of manufacturing an active matrix type display device of this embodiment, after the active elements are formed, will be described with reference to FIGS. 7-10, in which the details of thin film transistors are omitted.

Figure 7:
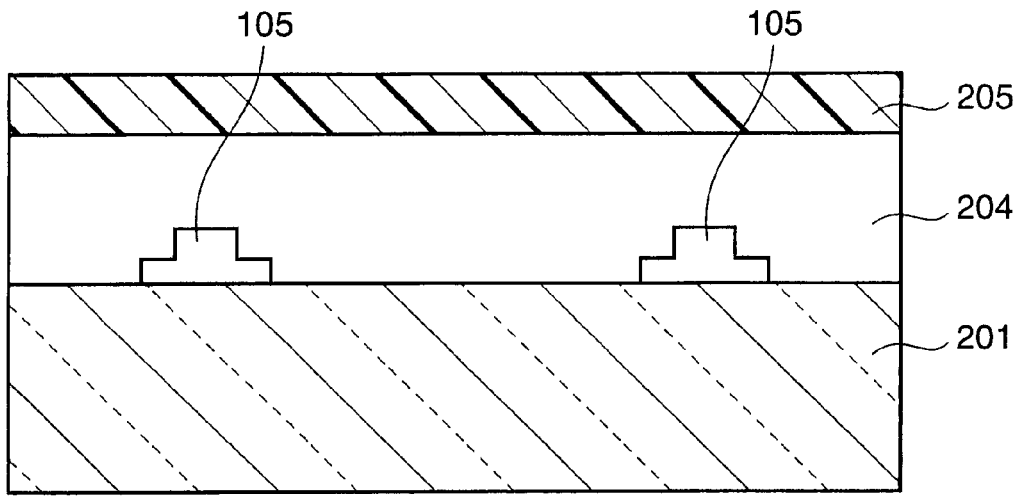
FIG. 7 is a sectional view showing a step of a method of transferring the active element of the active matrix type display device according to the first embodiment of the present invention.

As shown in FIG. 7, the surface of the glass substrate 201, on which the thin film transistors 105 are formed, is coated, without any space, with an adhesive agent, which is superior in hydrofluoric acid properties, and the adhesion power of which is weakened if it is irradiated with an ultraviolet light, so as to form a temporary adhesion layer 204. Further, a temporary substrate 205 of a fluoroplastic sheet, which is highly resistant to hydrofluoric acid, is provided on the temporary adhesion layer 204 so as to support to the glass substrate 201. The adhesion surface of the temporary substrate 205 is coated so as to improve the adhesion properties thereof with respect to an organic material.

Figure 8:
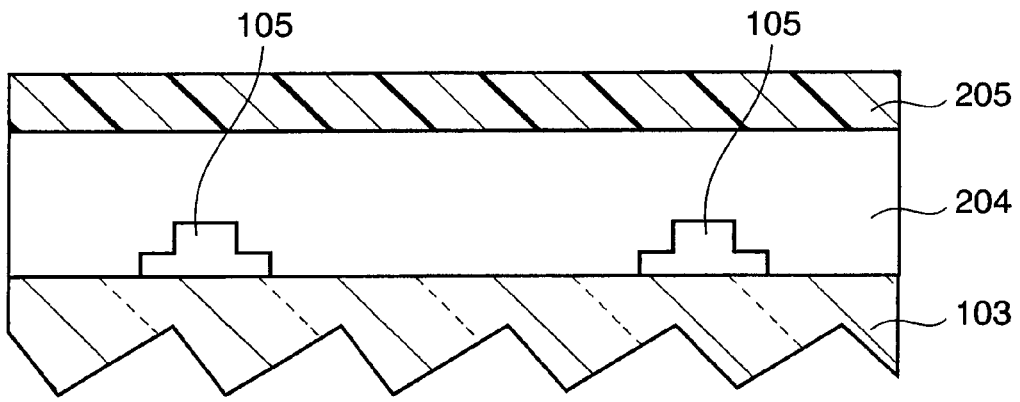
FIG. 8 is a sectional view showing a step of the method of transferring the active element of the active matrix type display device according to the first embodiment of the present invention.

As shown in FIG. 8, the glass substrate 201 is mechanically polished using a polishing agent, with the level of coarseness of the polishing agent being adjusted, so that the thickness thereof becomes about 0.1 mm. In this way, the glass substrate 201 becomes the thin glass layer 103.

Figure 9:
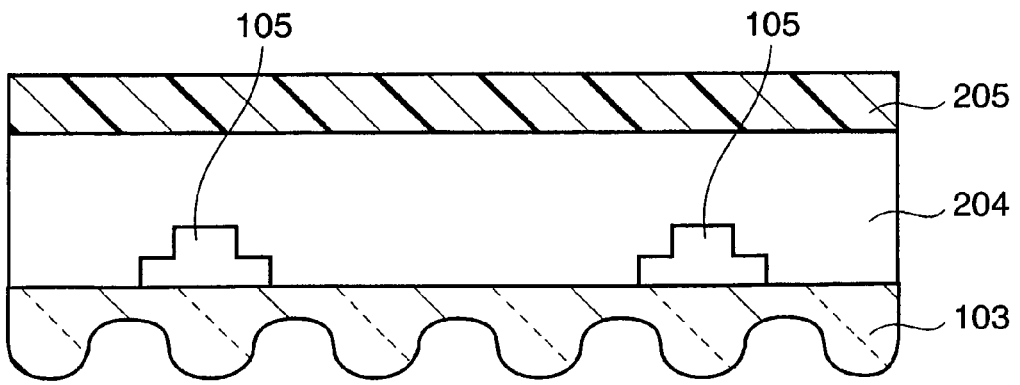
FIG. 9 is a sectional view showing a step of the method of transferring the active element of the active matrix type display device according to the first embodiment of the present invention.

As shown in FIG. 9, after the mechanical polishing step, the entire workpiece is soaked in a hydrofluoric acid solvent so as to chemically polish the workpiece. In this way, the thickness of the thin glass layer 103 becomes about 30 □m. At this time, it is preferable that after the thickness of the thin glass layer 103 reaches a predetermined level, ammonia, for example, is added to the hydrofluoric acid solvent so as to adjust the etching rate.

It is preferable that the height of the projections and depressions of the thin glass layer is one fiftieth or more and one half or less of the thickness of the thin glass layer. If the height is less than one fifties of the thickness, the surface becomes substantially the same state as the surface of mirror. Therefore, the effect of stress relaxation cannot be expected. If the height is more than a half of the thickness, the internal stress of the glass is concentrated on the depressed portions. If the height is one twenties or more and a half or less of the thickness, the contact area between the thin glass layer 103 and the adhesion layer is increased, resulting in that it is possible to obtain a good adhesion properties.

It is preferable that the thickness of the thin glass layer 103 is about 5 □m or more in order to maintain the strength, and about 100 □m or less in order to keep it light. Further, in order to make the height of the projections and depressions of the thin glass layer 103 in the range of a fifties to a half of the thickness of the thin glass layer 103, the grain size (coarseness) of the polishing agent such as a grind stone is adjusted to have substantially the same size as the height of the projections and depressions to be made. For example, assuming that the thickness of the thin glass layer 103 is about 50 □m, and the height of the projections and depressions should be about a tenth of the thickness, a grind stone having a grain size of about 5 □m can be used.

Figure 10:
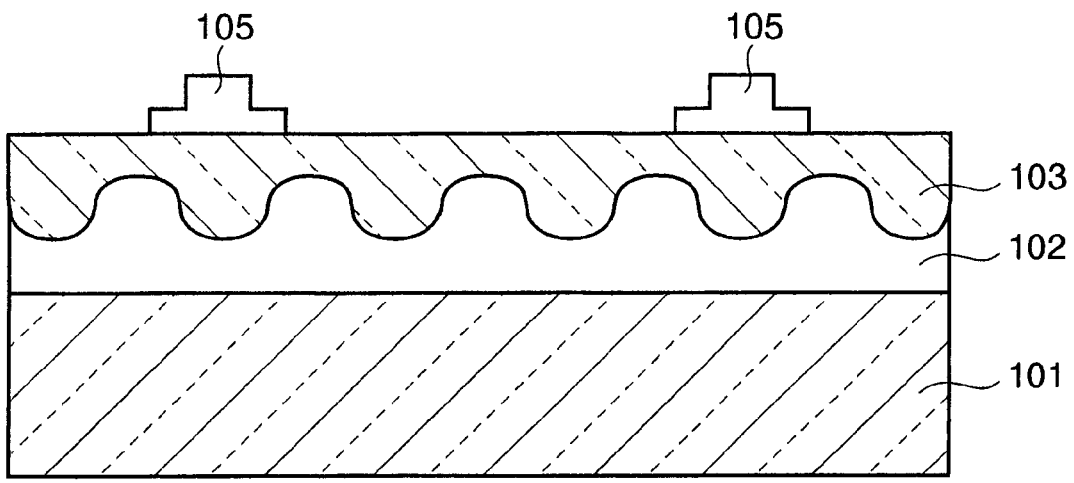
FIG. 10 is a sectional view showing a step of the method of transferring the active element of the active matrix type display device according to the first embodiment of the present invention.

As shown in FIG. 10, an adhesion layer 102 is formed all over the etched surface of the thin glass layer 103 after the thin glass layer 103 is fully cleaned. Then, a polyether sulfone (PES) film having a thickness of about 0.1 mm serving as a plastic substrate 101 is bonded to the adhesion layer 102 using the vacuum laminating technique.

Thereafter, the workpiece is irradiated with an ultraviolet light from the temporary substrate 205 side, thereby weakening the adhesion power of the temporary adhesion layer 204. Then, the intermediate substrate 205, together with the adhesion layer 204, is slowly peeled to expose the surface of the thin film transistor 105 such as the interlayer dielectric film 113. The constituent elements of the temporary adhesion layer 204, which may remain on the workpiece, are removed through the organic cleaning method using isopropanol, etc. Although the interlayer dielectric film 113 is exposed in this embodiment, the present invention is not limited to such a structure. For example, a protection layer of a novolac resin can be provided between the thin film transistors 105 and the temporary adhesion layer 204 so as to protect the thin film transistors 105. The scope of the selection of the material of the temporary adhesion layer 204 can be expanded by providing a protection layer.

Thereafter, the completed active matrix substrate and the opposing substrate 108, on which the opposing electrode 107 is formed, are combined to form a cell. Then, liquid crystal is injected therein to form the liquid crystal layer 106. Subsequently, the workpiece is sealed to complete the active matrix type display device of this embodiment.

Next, the glass substrate polishing step in the method of manufacturing an active matrix type display device in this embodiment will be described below.

Figure 11:
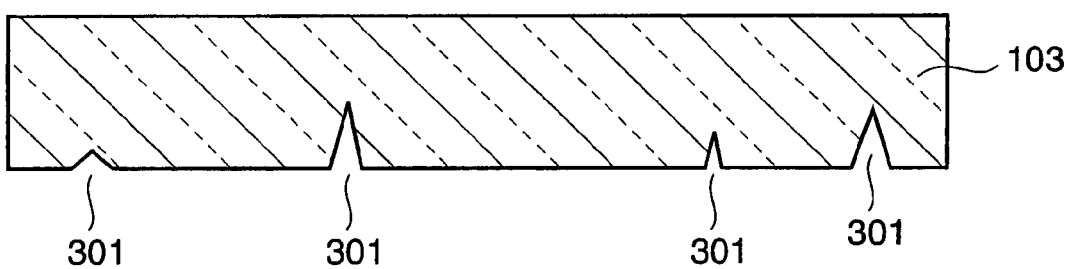
FIG. 11 is a sectional view schematically showing a thin glass layer after being subjected to a mechanical polishing step.
Figure 12:
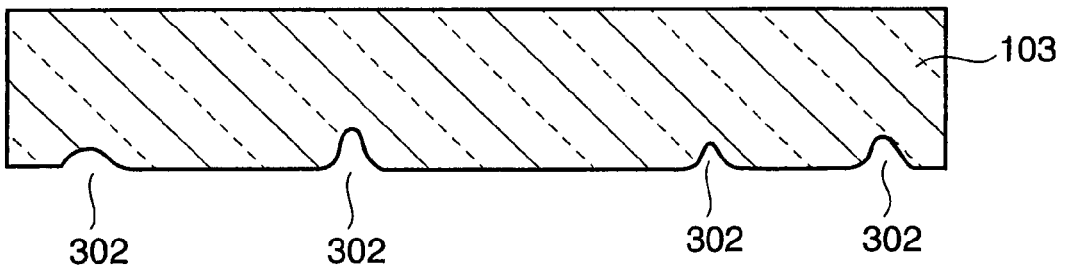
FIG. 12 is a sectional view schematically showing a thin glass layer after being subjected to a chemical polishing step performed after a mechanical polishing step.

In this embodiment, both the mechanical polishing step and the chemical polishing step are employed in the glass substrate polishing step. FIG. 11 schematically shows the thin glass layer 103 after being subjected to the mechanical polishing step, and FIG. 12 schematically shows the thin glass layer 103 after being subjected to the chemical polishing step that follows the mechanical polishing step. In the drawings, the lower side is the polished side. As shown in FIG. 11, there are a lot of sharp cracks 301 on the polished surface of the thin glass layer 103 after being subjected to the mechanical polishing step. Such cracks are formed by the polishing agent used in the mechanical polishing. Normally, the coarseness of the polishing agent is changed from the coarse to fine, e.g., #500, #1,000, #3,000, . . . in order to improve the smoothness of the polished surface. However, if a long time is taken to perform the mechanical polishing in such a manner, the productivity is deteriorated. In addition, it is difficult to know the status of the cracks and flows on the side opposite to the side on which the thin film transistors are formed. Accordingly, it is possible that a crack which may deteriorate the strength of the glass may be left.

Accordingly, in this embodiment, a chemical polishing is performed on the workpiece as shown in FIG. 11 to form a wavy structure as shown in FIG. 12, with the projections and depressions 302 having a height of a fifth or more and a half or less of the thickness of the thin glass layer 103. The wavy structure does not include any sharp edge. Thus, according to this embodiment, it is possible to obtain a strong thin glass layer without spending a long time for the mechanical polishing.

Figure 13:
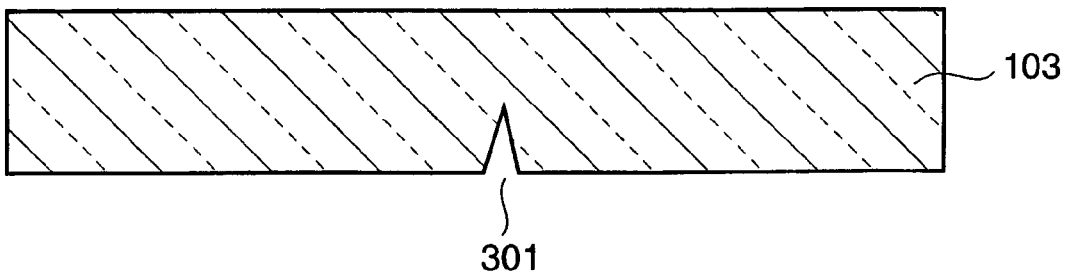
FIG. 13 is a sectional view showing a thin glass layer with some cracks left, which is obtained by performing a mechanical polishing on a glass substrate.
Figure 14:
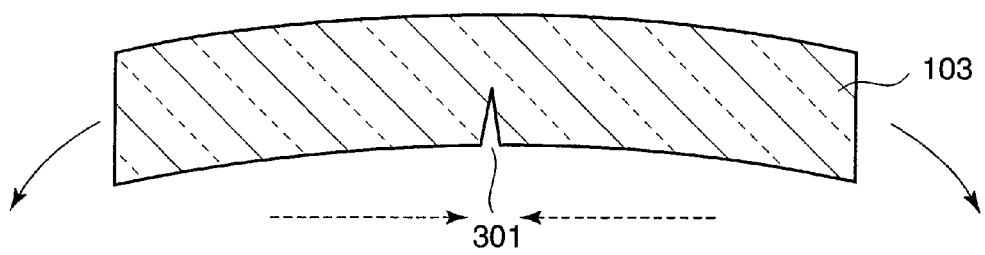
FIG. 14 is a sectional view showing a thin glass layer with some cracks left, which is obtained by performing a mechanical polishing on a glass substrate.
Figure 15:
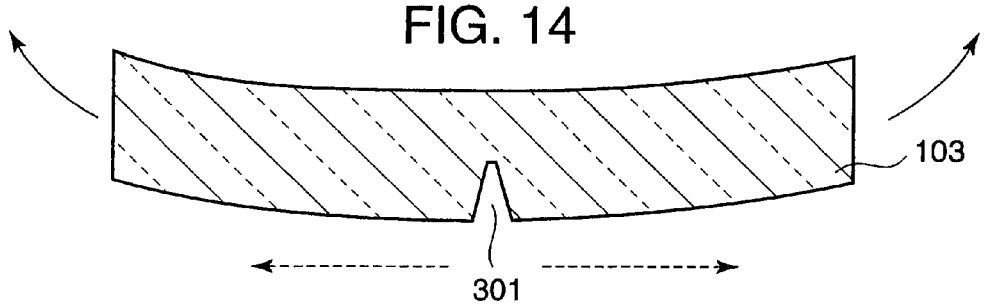
FIG. 15 is a sectional view showing a thin glass layer with some cracks left, which is obtained by performing a mechanical polishing on a glass substrate.

FIGS. 13-15 schematically shows the case where the thin glass layer after being subjected to the mechanical polishing has cracks. In the drawings, the lower side is the polished side. If there is a crack 301 developed from a flaw, which has not removed during the polishing of the thin glass layer 103, or which has been caused during the subsequent step, as shown in FIG. 13, the strength of the thin glass layer 103 may be weakened due to the existence of the crack 301.

If the entire display device (not shown) including the thin glass layer 103 is bent in the direction shown by solid line arrows in FIG. 14, a compressive stress is applied to the polished surface of the thin glass layer 103, while a tensile stress is applied to the surface opposing to the polished surface. Since a compressive stress in the direction of broken line arrows is applied to the crack 301, the crack 301 does not develop further.

However, if the entire display device (not shown) is bent in the direction shown by solid line arrows in FIG. 15, a tensile stress is applied to the polished surface of the thin glass layer 103, while a compressive stress is applied to the surface opposing to the polished surface. Accordingly, a tensile stress is intensively applied to the tip of the crack 301 as shown by broken line arrows. The flatter the polished surface of the thin glass layer is, and the fewer the number of cracks is, i.e., the better the fabrication condition is, the more intensively the stress is applied to the tips of the few cracks, thereby easily damaging the glass.

In the case where the wavy structure according to this embodiment is employed in the polished surface of the thin glass layer, regardless of the direction in which the entire display device including the thin glass layer is bent, the possibility of causing damage thereto is low. The reason is that there is no crack having a sharp tip because of the sufficient chemical polishing, which makes the tips of the cracks rounded.

Figure 16:
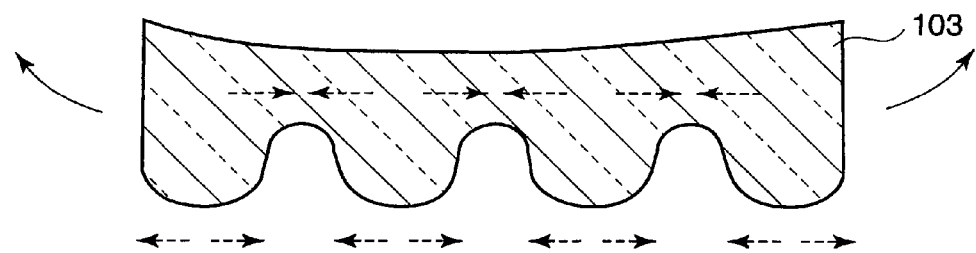
FIG. 16 is a sectional view for explaining stress relaxation due to the projections and depressions of a thin glass layer.
Figure 17:
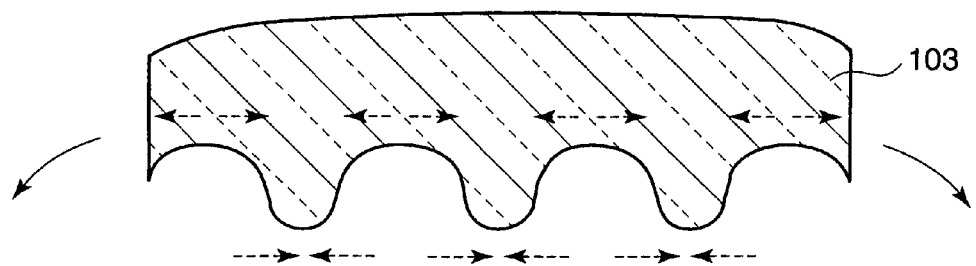
FIG. 17 is a sectional view for explaining stress relaxation due to the projections and depressions of a thin glass layer.

In this embodiment, a projection and a depression relax stress in the opposite directions. That is, as shown in FIG. 16, if the entire display device (not shown) is bent in the direction shown by solid line arrows, by which a tensile stress is applied to the entire polished surface of the thin glass layer having the projections and depressions, a tensile stress is applied to each projection, and a compressive stress is applied to each depression. On the contrary, if the entire display device (not shown) is bent in the direction shown by solid line arrows of FIG. 17, a compressive stress is applied to each projection, and a tensile stress is applied to each depression. Accordingly, as a whole, the stresses are relaxed.

Figure 18:
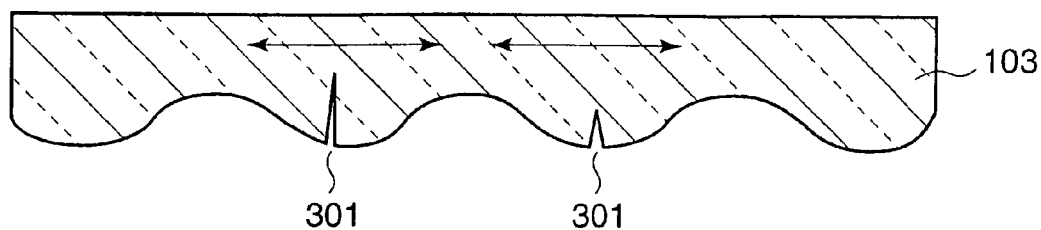
FIG. 18 is a sectional view for explaining stress relaxation due to the projections and depressions of a thin glass layer.

Further, as schematically shown in FIG. 18, even if cracks 301 are developed from flaws made during the manufacturing process after the thin glass layer 103 is shaped to have the projections and depression through the mechanical polishing step and the chemical polishing step, the stress intensively applied to the tip of each crack 301 is limited to the range of one projection and depression (as shown by an arrow in FIG. 18). Accordingly, the degree of such an intensively applied stress is considerably reduced as compared with that of the conventional device. Thus, the breaking strength of the thin glass layer 103 can be considerably increased.

Although a PES film is used as the plastic substrate in this embodiment, the material of the plastic substrate is not limited thereto, but other kinds of plastic substrate can be used. For example, a polyethylene terephthalate (PET) regin film having a thickness of about 0.1 mm can be used. Furthermore, a polyethylene naphthalate (PEN) resin, a polyolefin resin such as a polycarbonate (PC), a cycloolefin polymer, etc., an acrylic resin, a liquid crystal polymer, a reinforced plastic including an inorganic material, a polyimide, etc. can also be used.

Second Embodiment

Figure 19:
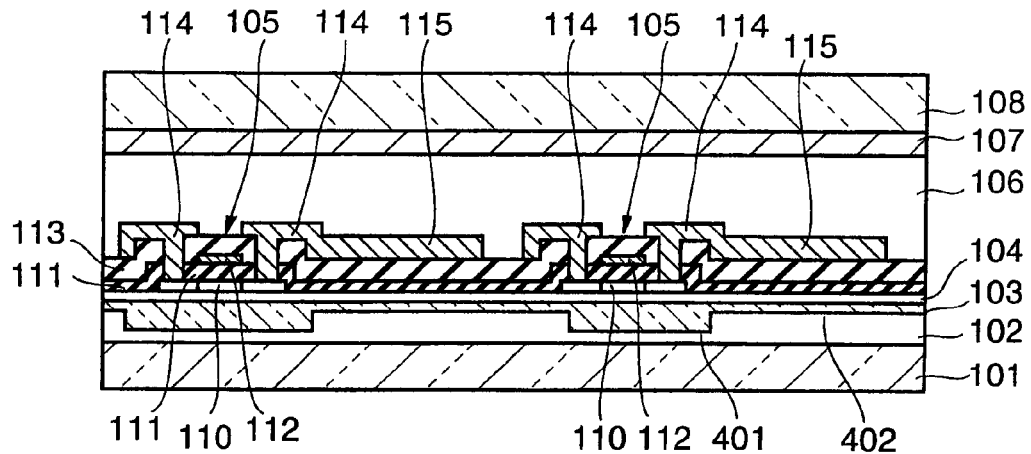
FIG. 19 is a sectional view showing an active matrix display device according to the second embodiment of the present invention.

Next, the second embodiment of the present invention will be described below. FIG. 19 is a sectional view showing an active matrix type display device according to this embodiment. FIGS. 20 to 23 are sectional views showing steps of a method of manufacturing the active matrix type display device of this embodiment. Although two devices are shown in FIG. 19, and one device is shown in FIGS. 20 to 23, in the actual device, a great number of such devices are arranged in a two-dimensional array. With respect to this embodiment, only the features different from those of the first embodiment will be described below, and the descriptions of the same features will be omitted.

In this embodiment, active matrix devices are formed on a glass substrate serving as a device forming substrate, and then, the thickness of the device forming substrate is reduced to make a thin glass layer. At this time, the thickness of the areas corresponding to at least the active elements is made thicker, and the thickness of the other areas is made thinner. In an active matrix type display device having a device forming substrate, on which active elements, e.g., thin film transistors, are formed, multiple layers of thin films are formed in the areas where the thin film transistors are formed. Accordingly, such areas are considered to locally receive a large stress as compared with other areas, e.g., the pixel areas, which do not have thin film transistors and wirings. Therefore, from the mechanical viewpoint such as reinforcement of strength, it is preferable that the thickness of the thin glass layer is made thicker in the areas where the thin film transistors and wirings are formed, as compared with the other areas. Furthermore, it is also preferable that the thin glass layer serving as a block layer for blocking moisture, etc., is relatively thick so as to maintain the chemical stability of the active layers of the thin film transistors.

As shown in FIG. 19, the active matrix type display device of this embodiment is substantially the same as that of the first embodiment, except that the projections and depressions of the thin glass layer 103 are made thicker in a thin glass portion 401 corresponding to the thin film transistors 105 and the wirings, and are made thinner in a thin glass portion 402 corresponding to the other areas.

Next, a method of manufacturing an active matrix type display device in this embodiment will be described with reference to FIGS. 20 to 23. Since the method of manufacturing an active element is the same as that in the first embodiment, the descriptions thereof are omitted.

Figure 20:
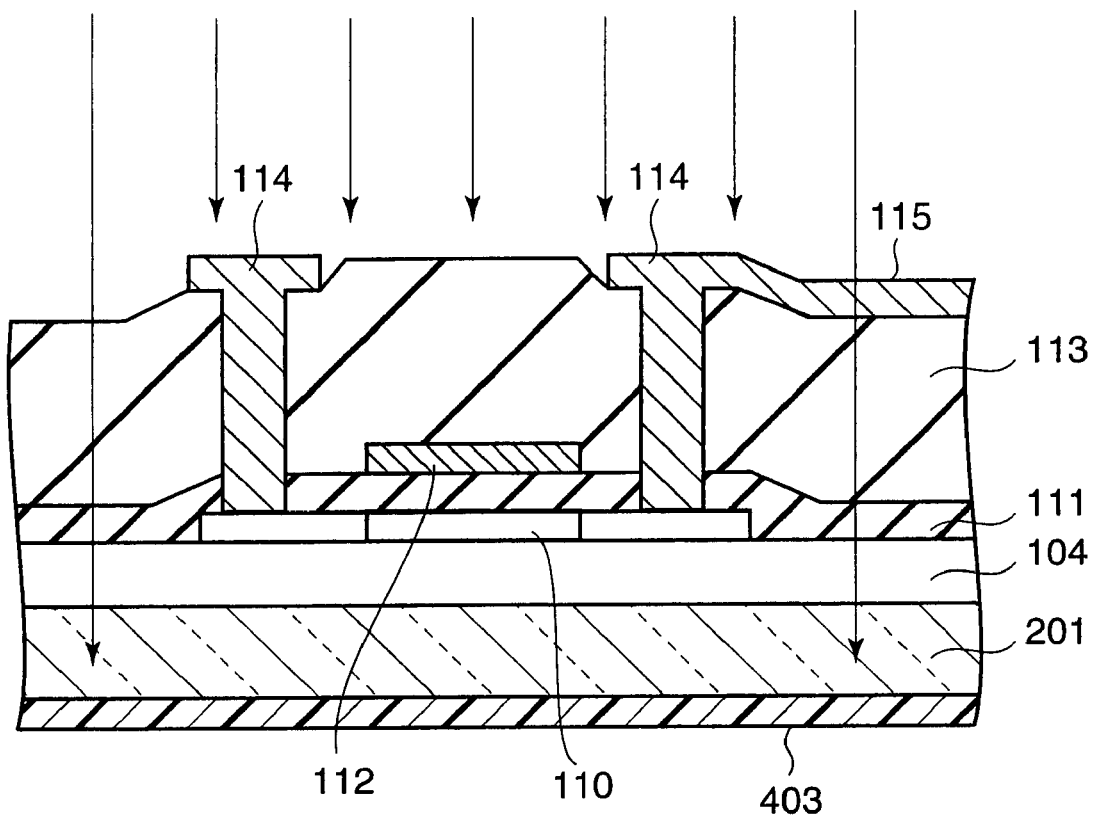
FIG. 20 is a sectional view showing a step of a method of manufacturing the active matrix type display device according to the second embodiment of the present invention.

As shown in FIG. 20, a positive type resist 403 of, e.g., a novolac resin, having a thickness of about 5 □m is evenly applied to the back surface of the glass substrate 201, on which the thin film transistor 105 is formed. Then, the workpiece is exposed to a light emitted from the side of the thin film transistor 105, with a light intensity being sufficient to pattern the positive type resist 403.

Figure 21:
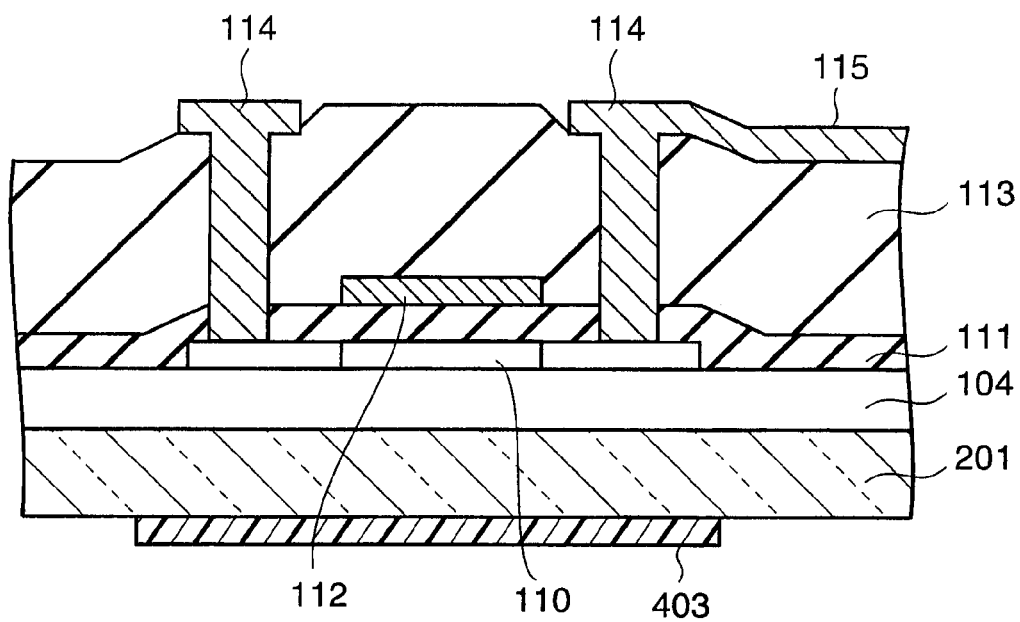
FIG. 21 is a sectional view showing a step of the method of manufacturing the active matrix type display device according to the second embodiment of the present invention.

As shown in FIG. 21, a pattern, in which only the masked resist 403 is left, is formed using the thin film transistor 105 and the wirings (not shown) as masks, through the developing method. At this time, the baking temperature can be relatively low, about 100° C., so that the resist 403 is dissolved or peeled when the workpiece is soaked in a hydrofluoric acid solvent later.

Figure 22:
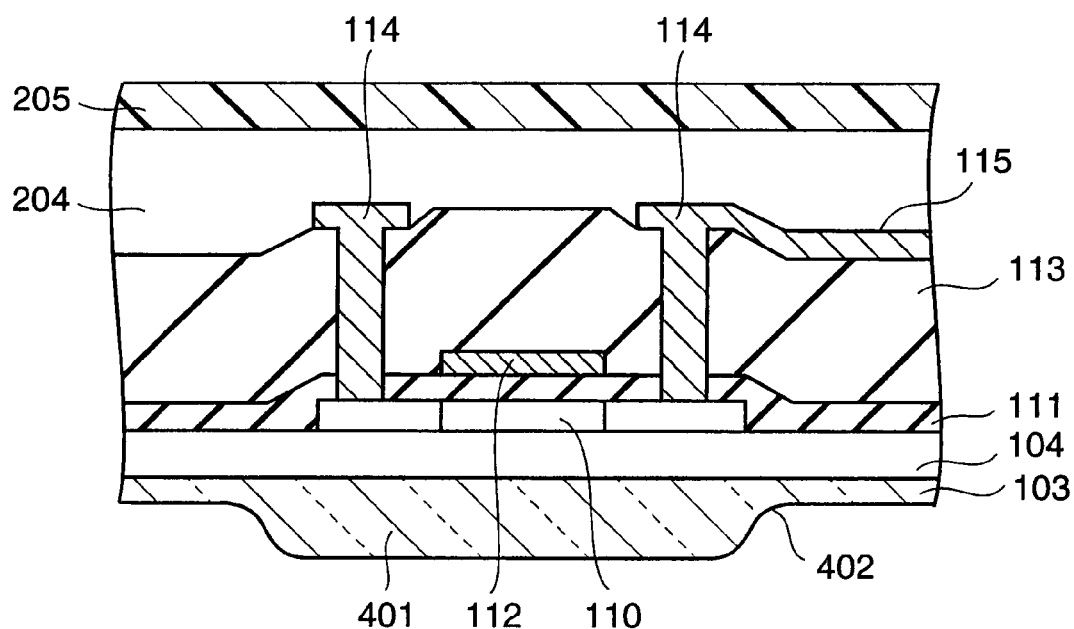
FIG. 22 is a sectional view showing a step of the method of manufacturing the active matrix type display device according to the second embodiment of the present invention.

As shown in FIG. 22, an adhesive agent, which is superior in the resistance to hydrofluoric acid, and the adhesion power of which is weakened when it is irradiated with an ultraviolet light, is coated, without any space, over the surface of the glass substrate 201 (shown in FIG. 21), which is not the side of the resist pattern 403 (shown in FIG. 21). The coated adhesive agent serves as a temporary bonding agent 204. A temporary substrate 205 of a fluoroplastic sheet, which is highly resistant to hydrofluoric acid, is provided on the temporary adhesion layer 204 so as to support to the glass substrate 201. The surface of the temporary substrate 205 at the side of the temporary adhesion layer 204 is coated so as to improve the adhesion properties with respect to an organic material. Then, the entire workpiece is soaked in a hydrofluoric acid solvent so that the thickness of the glass substrate 201 becomes about 30 □m, to obtain a thin glass layer 103. At this time, it is preferable that after the thickness of the glass substrate 201 reaches a predetermined level, ammonia, for example, is added to the hydrofluoric acid solvent so as to adjust the etching rate. Since the patterned resist 403 does not have a sufficient resistance to hydrofluoric acid, it is peeled off a little time after the workpiece is soaked in the hydrofluoric acid solvent. In this way, the thickness of the thin glass portion 401 of the thin glass layer 103 corresponding to the thin film transistor 105 becomes relatively thick, i.e., about 50 □m, and the thickness of the thin glass portion 402 corresponding to the other areas becomes relatively thin, i.e., about 25 □m.

Figure 23:
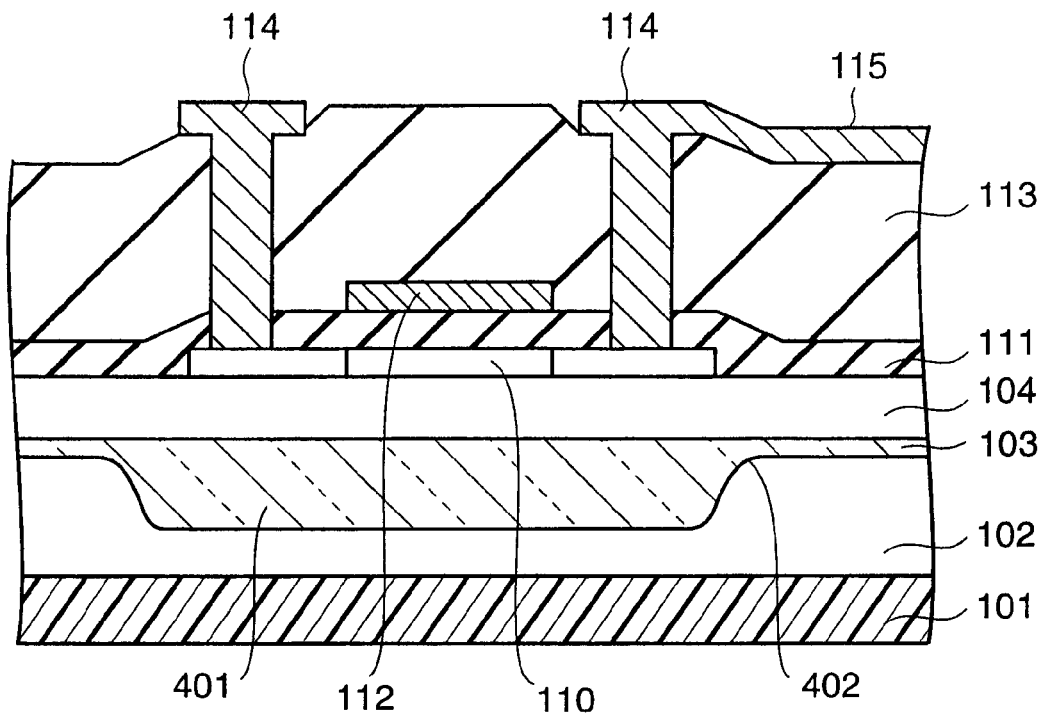
FIG. 23 is a sectional view showing a step of the method of manufacturing the active matrix type display device according to the second embodiment of the present invention.

As shown in FIG. 23, an adhesion layer 102 is formed all over the etched surface of the thin glass layer 103 after the thin glass layer 103 is fully cleaned. Then, a polyether sulfone resin (PES) film having a thickness of about 0.1 mm serving as a plastic substrate 101 is bonded to the adhesion layer 102 using the vacuum laminating technique.

Thereafter, the active matrix type display device of this embodiment is completed in the same manner as the first embodiment.

In this embodiment, the thickness of the thin glass layer is made thicker in the areas protected by the resist, corresponding to the thin film transistors and the wirings. This can be performed in a self-aligned manner since the start of the etching process is delayed at these areas due to the existence of the resist. Further, in this embodiment, it is possible to make a smooth wavy structure having the cycle unit of a thin film transistor and a wiring portion. The reason for this is that the projections and depressions of the thin glass layer are formed with the help of the resist in the initial stage of the etching of the glass substrate. As the etching process proceeds, the boundaries between the projections and the depressions are made smooth. For this reason, the effect of the projections and depressions explained in the descriptions of the first embodiment can also be obtained for this embodiment. In this embodiment, the cross-sectional shape of the thicker portions of the thin glass layer can be rounded square, rounded rectangular, trapezoid, etc. Further, the size of the projections is not necessarily the same as the size of the device portion or the wiring portion, but can be larger or smaller.

In this embodiment, the etching selectivity is based on the soft baking of the resist. However, the etching method is not limited thereto. For example, if the residue of the resist may cause a problem, a hard-baking of the patterned resist at a temperature of 140° C. is performed with a certain degree of hydrofluoric acid-resistant properties being left. Then, the glass substrate is etched for a few tens of □m using a hydrofluoric acid solvent containing ammonium, which can reduce the effect on the resist, then the resist is peeled off, and then a further etching of the glass substrate is performed, thereby obtaining the same structure.

Furthermore, in this embodiment, the exposure step is performed after the formation of the thin film transistor portion and the wiring portion including the signal lines and the gate lines, and the exposure is performed from the side where the thin film transistors and wirings are formed. Accordingly, the thickness of the thin glass layer in the areas including all of such thin film transistors and wirings is made thicker. However, the present invention is not limited thereto. For example, in the case where the active matrix type display device should be more flexible in the direction of the signal lines, if the thin glass layer is thick in the areas directly below the signal lines, the required flexibility of the device is inhibited. In such a case, it is possible to form a resist pattern on the backside of the glass substrate before the formation of the signal lines. Similarly, it is possible to make the thin glass layer thicker in the areas corresponding only to the thin film transistors. It is preferable that the difference between the thickness of the thicker areas and the thickness of the thinner area of the thin glass layer is about a fifth or more and a half or less of the thickness of the thicker areas. The reason for this is the same as that explained in the descriptions of the first embodiment.

Furthermore, in accordance with the periodicity of the wavy structure and the characteristics of the display device, it is possible to perform the exposure step using masks when the backside pattern is formed, as in the case of an ordinary photoetching step, to form a predetermined pattern. Further, it is possible to perform the exposure step on the resist using masks as in the case of the ordinary photoetching step in order to form the projections and depressions in the process of forming a thin glass layer having projections and depressions with a height of a fifth or more and a half or less of the thickness of the thin glass layer, as mentioned in the descriptions of the first embodiment.

Third Embodiment

Figure 24:
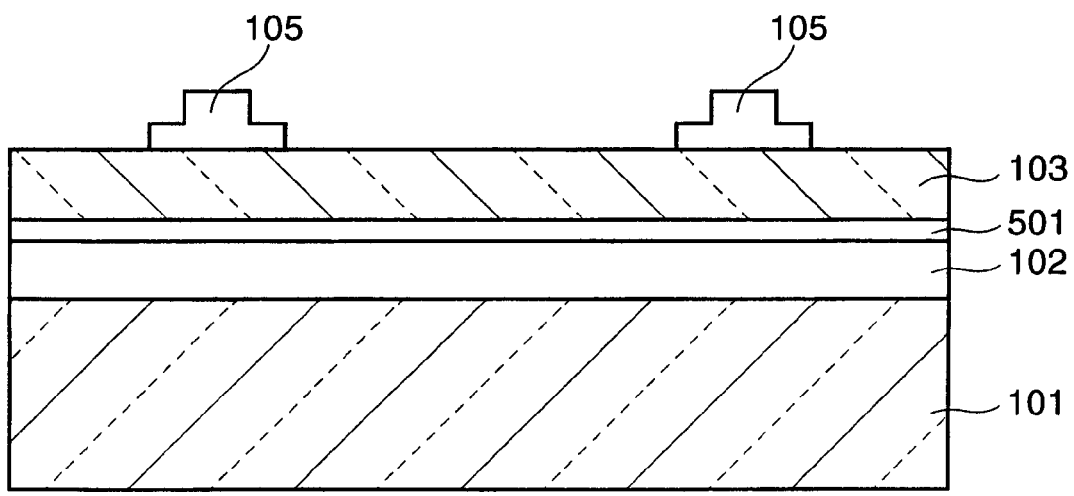
FIG. 24 is a sectional view showing an active matrix type display device according to the third embodiment of the present invention.
Figure 26:
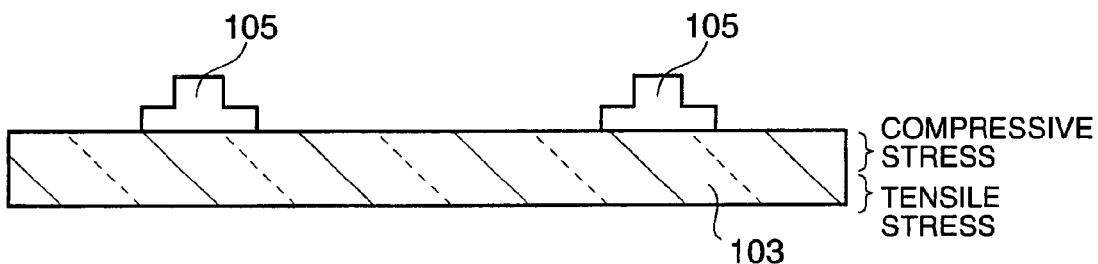
FIG. 26 is a sectional view for explaining the status of stress applied to a thin glass layer obtained by reducing the thickness of a normal glass substrate.
Figure 27:
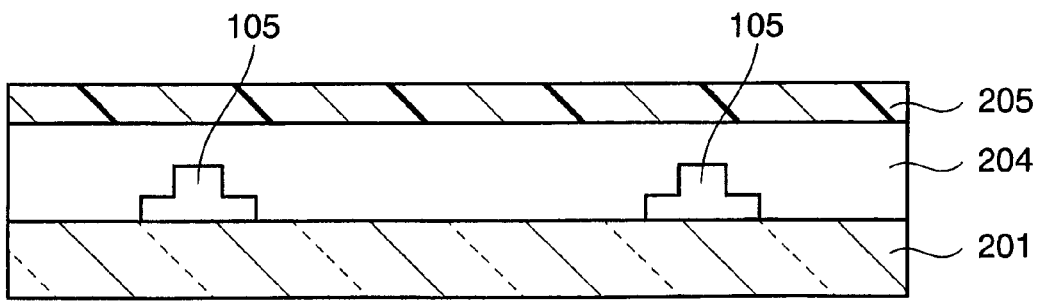
FIG. 27 is a sectional view showing a step of a method of manufacturing the active matrix type display device according to the third embodiment of the present invention.
Figure 28:
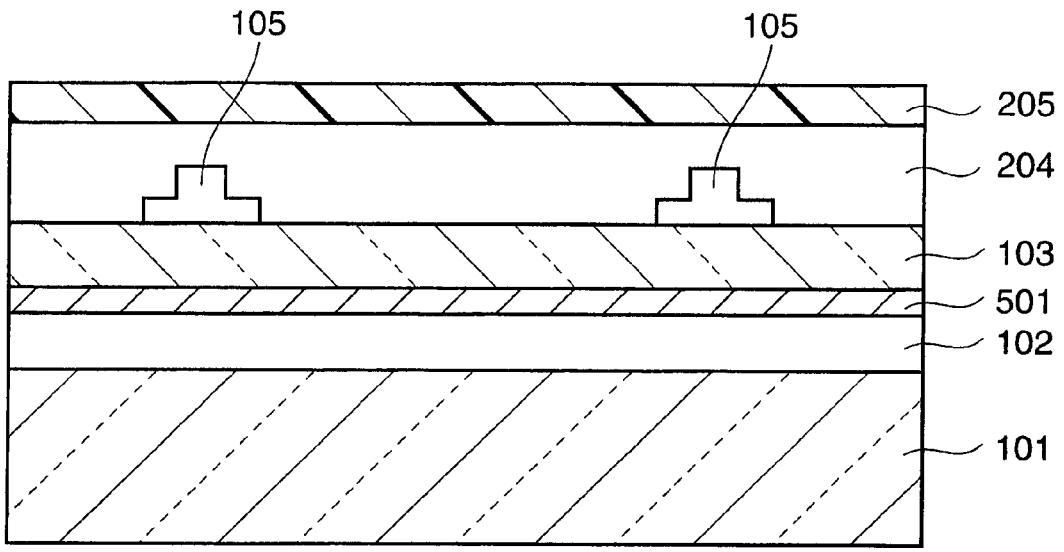
FIG. 28 is a sectional view showing a step of the method of manufacturing the active matrix type display device according to the third embodiment of the present invention.
Figure 29:
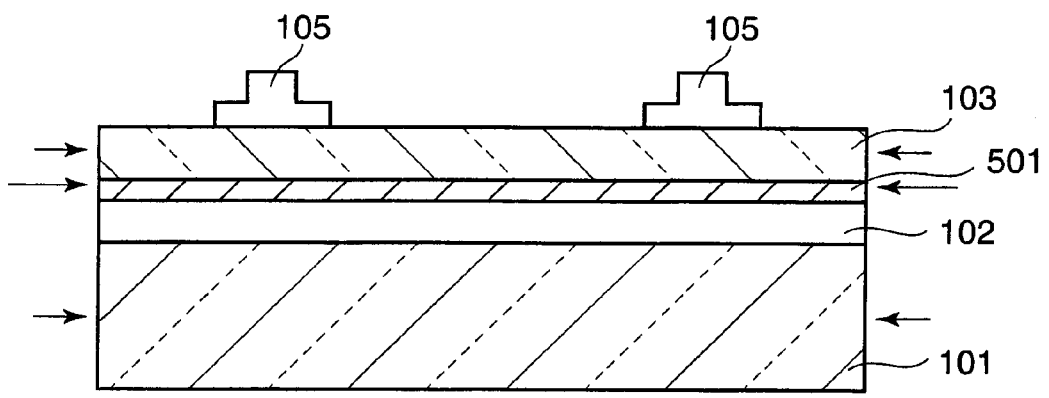
FIG. 29 is a sectional view showing a step of a method of manufacturing the active matrix type display device according to the third embodiment of the present invention.

Next, the third embodiment of the present invention will be described below. FIG. 24 is a sectional view showing an active matrix type display device of this embodiment. FIGS. 27 to 29 are sectional views showing the steps of a method of manufacturing the active matrix type display device according to this embodiment. Although only two devices are shown in FIGS. 26 to 29, actually there are a great number of such devices arranged in a two-dimensional array. The details of the thin film transistors are not shown. With respect to this embodiment, only the difference between this embodiment and the first embodiment will be described, and the descriptions on the same features will be omitted.

In this embodiment, active elements are formed on a glass substrate serving as a device forming substrate. Then, the thickness of the device forming substrate is decreased to form a thin glass layer. Subsequently, a compressive stress applying layer is formed on the polished surface of the thin glass layer using a material having a larger coefficient of linear expansion than the glass. Then, the compressive stress applying layer is cooled to apply a compressive stress on the polished surface of the thin glass layer.

Figure 25:
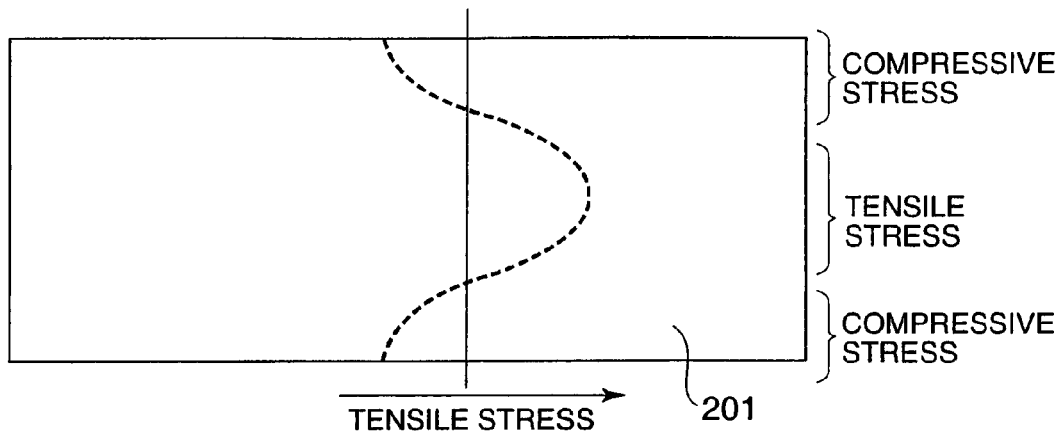
FIG. 25 is a sectional view for explaining the status of stress applied to a normal glass substrate.

In many cases, a compressive stress is applied on both sides of a glass substrate, as shown in FIG. 25. The reason for this is that the development of a crack, which may lead to the breaking of glass, is caused by a tensile stress applied to the tip of the crack. Such a compressive stress is applied to a non-alkali glass substrate which is normally used in an active matrix type display device. When thin film transistors 105, etc. are formed on a glass substrate and the thickness of the glass substrate is decreased to form a thin glass layer 103 as shown in FIG. 26, a compressive stress is applied to a side of the thin glass layer 103 on which the thin film transistors 105 are formed. However, since the thickness of the glass substrate has been decreased, a tensile stress is applied to a side of the thin glass layer 103 opposite to the side on which the thin film transistors 105 are formed. Accordingly, if a crack exists on this side, it receives a tensile stress from the initial stage. If a further tensile stress is applied to this portion by, e.g., bending the entire display device, the tip of the crack easily receives a considerable level of tensile stress.

In order to solve this problem, the mechanical strength of the thin glass layer can be improved by forming a compressive stress applying layer on the surface of the thin glass layer opposite to the surface on which the thin film transistors are formed. Although it is possible to apply a certain degree of compressive stress to that surface by the adhesion layer for bonding the thin glass layer and the plastic substrate, it is not possible to apply a great deal of compressive stress in this way. With the structure of this embodiment, even if a soft material such as an epoxy adhesive is used as the adhesion layer, it is possible to apply a compressive stress to the thin glass layer without being relaxed by the adhesion layer. In this case, the compressive stress applying layer should have a coefficient of linear expansion greater than the glass substrate, and should be cooled after the formation thereof to apply a compressive stress to the thin glass layer by the shrinkage of the compressive stress applying layer.

Next, a method of manufacturing the active matrix type display device according to this embodiment will be described with reference to FIGS. 27 to 29. Since the method of forming active elements in this embodiment is the same as that in the first embodiment, the descriptions thereof are omitted. In this embodiment, the display device is a reflection type liquid crystal display device, and the compressive stress applying layer can also serve as a reflection layer.

As shown in FIG. 27, a surface of the glass substrate 201, on which the thin film transistors 105 are formed, is coated with an adhesive agent, which is superior in the resistance to hydrofluoric acid, and the adhesion power of which is weakened if it is irradiated with an ultraviolet light, so as to form a temporary adhesion layer 204. Further, a temporary substrate 205 of a fluoroplastic sheet, which is highly resistant to hydrofluoric acid, is provided on the temporary adhesion layer 204 so as to oppose to the glass substrate 201. The adhesion surface of the intermediate substrate 205 is coated so as to improve the adhesion properties with respect to an organic material.

As shown in FIG. 28, the glass substrate 201 is mechanically polished using a polishing agent, with the level of coarseness of the polishing agent being adjusted, so that the thickness thereof becomes about 0.1 mm to form the thin glass layer 103. Thereafter, the entire workpiece is soaked in a hydrofluoric acid solvent so that the thin glass layer 103 is dissolved until the thickness thereof becomes about 30 □m. It is preferable that when the thickness of the glass substrate reaches a certain level, ammonia etc. is added to the hydrofluoric acid solvent in order to adjust the etching rate. Subsequently, the workpiece is sufficiently cleaned. Then, aluminum (Al) is grown on a surface of the thin glass layer 103, on which the thin film transistors 105 are not formed, i.e., the etched surface, through the sputtering method until the thickness thereof becomes about 100 nm. This aluminum layer serves as a compressive stress applying layer 501. At this time, the substrate temperature is set to be at 100° C.

Then, an adhesion layer 102 is formed all over the compressive stress applying layer 501 using an adhesive agent superior in the adhesion properties. Subsequently, a polyether sulfone resin (PES) film having a thickness of about 0.1 mm and serving as the plastic substrate 101 is bonded to the adhesion layer 102 using the vacuum laminating technique. At this time, the temperature is maintained to be about 100° C.

Then, as shown in FIG. 29, the temperature is lowered to an ambient temperature (e.g., 23° C.) at a temperature lowering rate of about 10° C./min. Normally, there is over an order of magnitude difference between the coefficient of linear expansion of glass and that of aluminum. For example, for many glass substrates, the coefficient of linear expansion is on the order of $10^{-7}/°$ C., while the coefficient of linear expansion of aluminum is on the order of $2\times10^{-5}/°$ C. Accordingly, as shown by arrows in FIG. 29, in the temperature lowering process performed after the formation of the compressive stress applying layer 501, a compressive stress is applied to the thin glass layer 103 from the side of the compressive stress applying layer since the compressive stress applying layer 501 shrinks in the temperature lowering process, while the thin glass layer 103 does not shrink very much.

Thereafter, the active matrix type display device according to this embodiment is completed in the same manner as the first embodiment.

In this embodiment, a phenomenon may occur that the entire active matrix substrate is warped due to the stress relaxation during the temperature lowering process which is performed after the thin glass layer and the plastic substrate are bonded. It is possible to prevent this phenomenon by inserting the active matrix substrate between two glass substrates each having a thickness of about 1.1 mm, and having a smooth surfaces, and then lowering the temperature.

Further, in this embodiment, it is possible to prevent the generation a tensile stress that may develop a crack even at the backside of the thin glass layer, on which no compressive stress has been applied, by forming a compressive stress applying layer on the surface of the thin glass layer contacting the adhesion layer.

Since the display device in this embodiment is a reflection type liquid crystal display device, aluminum is used to form the compressive stress applying layer. However, the material of the compressive stress applying layer is not limited to aluminum, but any material having a larger coefficient of linear expansion than glass, such as silver, molybdenum, copper, an alloy including any of aluminum, silver, molybdenum, and copper, can be used. Further, the deposition method is not limited to the sputtering method, but can be the chemical deposition method, etc. It should be noted, however, that since a compressive stress caused by the difference between coefficients of linear expansion should be applied to the surface of the thin glass layer, the selected deposition method should allow a heat treatment at a temperature of, e.g., about 150° C., which may not cause damage to the thin glass layer. Moreover, although a metal material, which does not have light transmission properties, is used as the material of the compressive stress applying layer in this embodiment, there is a case where a light transparent material should be used, as in the case of a transparent liquid crystal display device. The present invention can be employed even in such a case by depositing a glass material having a larger coefficient of linear expansion than the thin glass layer by using, e.g., the RF sputtering method. For example, if an alumino-boro silicate glass material is used to form a device forming substrate, a lead glass using lead-potassium-sodium silicate or soda-lime glass having a large coefficient of linear expansion can be used as the compressive stress applying layer. Since there is no high-temperature processing or chemical processing after the formation of the compressive stress applying layer, there is no problem even if a lead glass or a soda lime glass, which does not have good heatproof or chemical-proof properties, is used.

Fourth Embodiment

Figure 30:
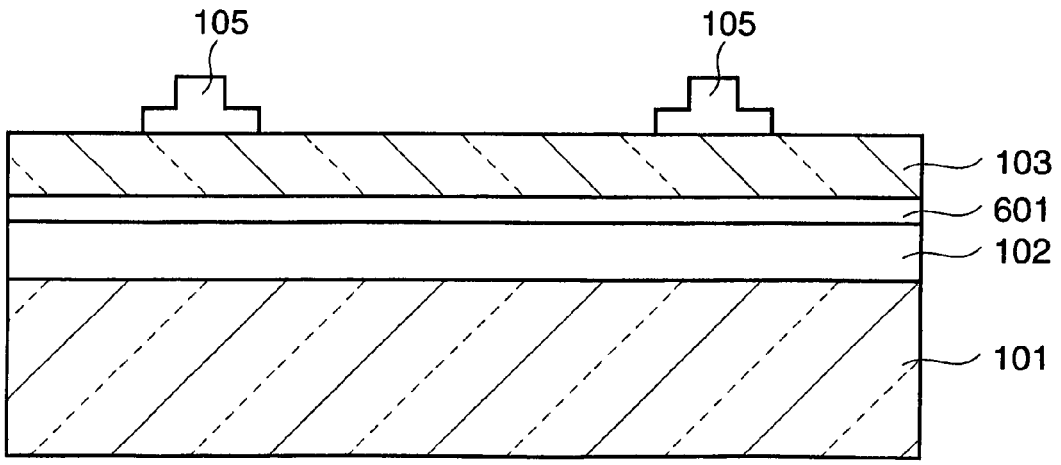
FIG. 30 is a sectional view showing an active matrix type display device according to the fourth embodiment of the present invention.

Next, the fourth embodiment of the present invention will be described. FIG. 30 is a sectional view showing an active matrix type display device of this embodiment. Although only two devices are shown in FIG. 30, actually there are a great number of such devices arranged in a two-dimensional array. Further, the details of the active elements are omitted. With respect to this embodiment, only the features that the first embodiment does not have will be described, and the descriptions of the same features will be omitted.

In this embodiment, there is provided a hydroxyl group blocking layer for blocking the soakage of molecules having hydroxyl groups, which exist on the surface of the thin glass layer at the adhesion layer side bonded to the plastic substrate, and may help the development of cracks. As mentioned in the descriptions of the first embodiment, there is provided on the active element side of the thin glass layer an undercoat layer such as a silicon oxide layer for preventing the trace of alkali elements etc. from seeping from the glass substrate. This undercoat layer also works to prevent the soakage of molecules having hydroxyl radicals from the active element side. However, on the surface of the polished surface of the thin glass layer, there is no such layer to prevent the soakage of molecules having hydroxyl radicals into cracks existing. Accordingly, molecules having hydroxyl groups contained in the moisture in the atmosphere air or the adhesion layer may easily reach the tips of cracks, thereby advancing the development of the cracks, which may lead to the breaking of the glass. Accordingly, if a layer for preventing the soakage of molecules having hydroxyl groups into the polished surface of the thin glass layer is employed, the strength of the glass layer may be considerably improved.

As shown in FIG. 30, the active matrix type display device of this embodiment does not have projections and depressions on the thin glass layer 103, as in the case of the first embodiment. Alternatively, there is provided a hydroxyl group blocking layer 601 between the thin glass layer 103 and the adhesion layer 102.

A method of manufacturing an active matrix type display device according to this embodiment differs from the first embodiment in that after the thickness of the glass substrate is decreased to form the thin glass layer 103, no projection nor depression is formed thereon, unlike the first embodiment, but a hydroxyl group blocking layer 601 is formed by applying a silane coupling agent such as dichlorohydroxypropyltrimethylsilane to the polished surface of the glass, and heat-treating the workpiece at a relatively low temperature, such as 70° C., for about an hour. FIG. 31 shows a chemical formula that can be applied to the silane coupling agent of this embodiment.

Since the hydroxyl group blocking layer 601 is provided on the thin glass layer 103, oxygen atoms and hydrogen atoms of the silane coupling agent form hydrogen bonds in the hydroxyl group blocking layer 601 provided at the polished surface side of the thin glass layer 103. Accordingly, there exist alkyl groups on the surface of the hydroxyl group blocking layer 601, which prevent the soakage of molecules having hydroxyl groups.

The material of the hydroxyl group blocking layer 601 can be a silane coupling agent, preferably a material including at least one of 3-glycidoxylpropyl-trimethoxysilane, 3-[(methacryloyloxy)propyl]-trimethoxysilane, N-[3-(trimethoxysilyl)propyl]-ethylenediamine, and 3,3,4,4,5,5,6,6,7,7,8,8,8-tridecafluorooctyl-trimethoxysilane.

Further, not only an organic material such as a silane coupling agent but also an inorganic material can be used to form the hydroxyl group blocking agent 601. For example, it is possible to apply polysilazane dissolved in xylene to the polished surface of the thin glass layer 103 by the spin coating method, and to heat treat the workpiece in the atmosphere air at a temperature of 200° C. for about three hours, thereby forming a silicon oxide layer having a thickness of about 100 nm on the surface of the thin glass layer 103. The silicon oxide layer thus formed can serve as a layer for preventing hydroxyl groups from reaching the polished glass surface. Further, since the spin coating method is used in the deposition step, cracks and flaws, if any, of the polished glass surface can be protected.

Fifth Embodiment

Figure 32:
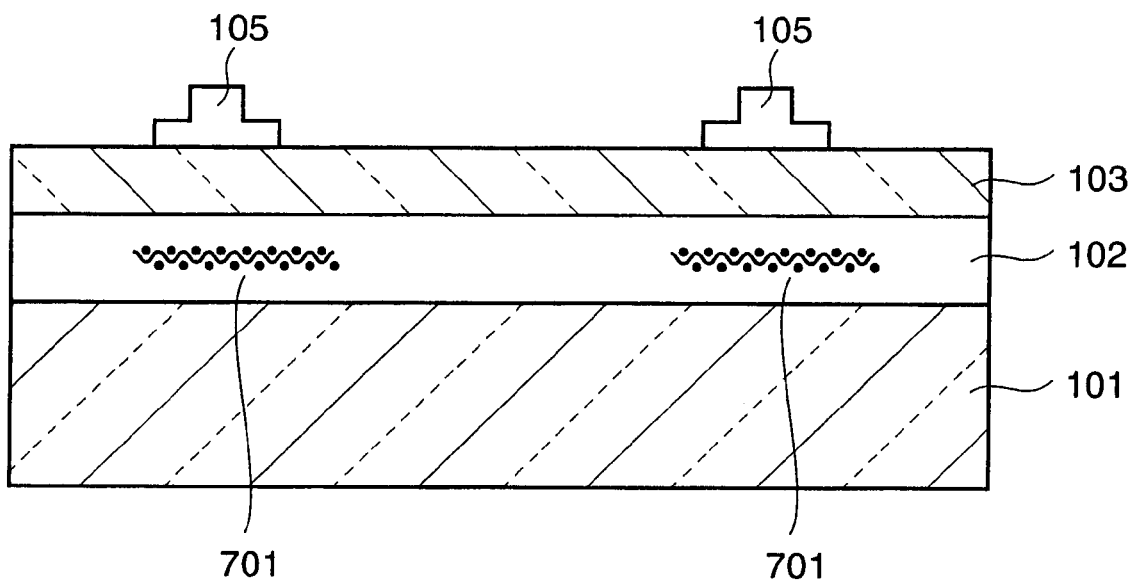
FIG. 32 is a sectional view showing an active matrix type display device according to the fifth embodiment of the present invention.

Next, the fifth embodiment of the present invention will be described below. FIG. 32 shows a sectional view of an active matrix type display device according to this embodiment. Although only two devices are shown in FIG. 32, actually there are a great number of such devices arranged in a two-dimensional array. Further, the details of active elements are omitted. With respect to this embodiment, only the features which are different from the feature of the first embodiment will be described, and the descriptions of the same features will be omitted.

In this embodiment, a reinforcing member 701 having a mesh structure is provided in the adhesion layer 102. It is preferable that the reinforcing member 701 is provided directly below the active element 105 in the adhesion layer 102. In this way, it is possible to reinforce the thin glass layer 103 in the area where the active element 105 is formed, which has a relatively large residual stress, and thus is relatively weakened. Accordingly, it is possible to considerably improve the strength of the thin glass layer 103.

As shown in FIG. 32, the active matrix type display device of this embodiment does not include projections and depressions on the thin glass layer 103, unlike the first embodiment, but does include a reinforcing member 701 having a mesh structure in the adhesion layer 102.

The above-described embodiments can be combined to gain combined effects. For example, as the result of the combination of the first and third embodiments, it is possible to further improve the strength of the polished glass layer by the effect of having projections and depressions in the first embodiment, and the effect of preventing the entry of molecules having hydroxyl groups of the third embodiment. The combination is not limited to the first and third embodiments, but any combination of the above-described embodiments is possible.

Although the cases of a liquid crystal display device have been described relating to the above-described embodiments, the present invention is not limited to liquid crystal display devices, but can be applied to any devices requiring matrix driving. For example, the present invention can be applied to a self-luminance type display device such as an organic electroluminescence display, a display using electrophoresis devices. Further, if liquid crystal is used, the opposing electrode can be eliminated, a pair of comb-shaped pixel electrodes can be provided at the device circuit regions side, and an electric filed can be applied in the direction of display in order to drive the liquid crystal. If organic electroluminescence is used for the display, it is preferable that a peripheral driver circuit of current driving type is provided, and a pixel includes a selection switch composed of two to six transistors, a current supply purpose driving transistor, and a transistor property fluctuation correction circuit. These circuits can be conventionally-used circuits. Further, a plurality of thin film transistors can be used as active elements.

As described in detail, according to the present invention, even if a glass substrate is used as a device forming substrate, it is possible to provide an active matrix type display device, which is reliable and flexible as a whole, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An active matrix type display device comprising:
a first substrate, which is flexible;
an adhesion layer provided on the first substrate;
a thin glass layer provided above the adhesion layer;
a compressive stress applying layer provided between the adhesion layer and the thin glass layer, the compressive stress applying layer applying a compressive stress to a surface of the thin glass layer at a side of the adhesion layer;
active elements provided on the thin glass layer, each active element corresponding to a pixel;
a display provided above the thin glass layer, and driven by the active elements to display an image pixel by pixel; and
a second substrate provided on the display, and having an opposing electrode formed thereon.

2. The active matrix type display device according to claim 1, wherein a coefficient of linear expansion of the compressive stress applying layer is larger than a coefficient of linear expansion of the thin glass layer.

3. The active matrix type display device according to claim 2, wherein the compressive stress applying layer is formed of a material selected from the group consisting of aluminum, silver, molybdenum, copper, and an alloy containing any of aluminum, silver, molybdenum, and copper.

4. The active matrix type display device according to claim 2, wherein the compressive stress applying layer is formed of a material selected from a group consisting of lead glass and soda-lime glass.

5. The active matrix type display device according to claim 1, wherein the first substrate is formed of a plastic.

* * * * *